(12) United States Patent
Takesue

(10) Patent No.: US 7,491,893 B2
(45) Date of Patent: Feb. 17, 2009

(54) MOUNTING SUBSTRATE AND MOUNTING METHOD OF ELECTRONIC PART

(75) Inventor: Masakazu Takesue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 10/938,517

(22) Filed: Sep. 13, 2004

(65) Prior Publication Data
US 2005/0224560 A1 Oct. 13, 2005

(30) Foreign Application Priority Data
Apr. 13, 2004 (JP) ............................. 2004-118203

(51) Int. Cl.
*H05K 1/16* (2006.01)
(52) U.S. Cl. .................... 174/260; 174/261; 361/772
(58) Field of Classification Search ............... 174/260, 174/261; 361/774, 772, 773, 775, 776–779
See application file for complete search history.

(56) References Cited

U.S. PATENT DOCUMENTS

| | | | | |
|---|---|---|---|---|
| 4,509,994 A | * | 4/1985 | Barajas | 148/24 |
| 5,872,399 A | * | 2/1999 | Lee | 257/738 |
| 6,125,043 A | * | 9/2000 | Hauer et al. | 361/760 |
| 6,911,604 B2 | * | 6/2005 | Tsai et al. | 174/255 |

FOREIGN PATENT DOCUMENTS

| | | |
|---|---|---|
| JP | 56-7493 | 1/1981 |
| JP | 8-330718 | 12/1996 |
| JP | 9-293961 | 11/1997 |
| JP | 10-209592 | 8/1998 |
| JP | 11-135929 | 5/1999 |
| JP | 2004-095864 | 3/2004 |

OTHER PUBLICATIONS

Korean Office Action dated Apr. 24, 2006.

* cited by examiner

*Primary Examiner*—Jeremy C Norris
(74) *Attorney, Agent, or Firm*—Kratz, Quintos & Hanson, LLP

(57) ABSTRACT

A mounting substrate includes a land connected to an electrode of an electronic part by a melt-capable connection member; and a connection member flow-generation part configured to generate a flow at the molten melt-capable connection member.

14 Claims, 12 Drawing Sheets

(A)          (B)

(A)

(B)

US 7,491,893 B2

MOUNTING SUBSTRATE AND MOUNTING METHOD OF ELECTRONIC PART

BACKGROUND OF THE INVENTION

1. Field of the Invention

The present invention relates to mounting substrates and mounting methods of electronic parts, and more specifically, to a mounting substrate and a mounting method of an electronic part wherein it is possible to prevent a void from remaining in a melt-capable connection member after an electronic part is connected.

2. Description of the Related Art

A high density electronic part such as BGA (Ball Grid Array) or CSP (Chip Size package), for example, a semiconductor device, may be flip chip mounted on a mounting substrate. See the Japan Laid-Open Patent Application No. 9-293961. That is, a semiconductor part such as the BGA or CSP has a solder ball functioning as an outside connection terminal. The solder ball is connected to a land formed on the mounting substrate so that the semiconductor part is mounted on the mounting substrate.

Recently, it has been strongly demanded that an electronic apparatus where the semiconductor device is installed, for example, a mobile terminal device, be made miniaturized and thin. Because of this, the semiconductor device is also made to have a high density so that it has been attempted to make the solder balls, functioning as the outside connection terminals, with a fine and have narrow pitch. More specifically, although the diameter of a conventional solder ball is 760 μm, the diameter of a recent solder ball is approximately 300 μm. Furthermore, the pitch between the conventional solder balls is 1270 μm, while the pitch between the recent solder balls is 500 μm.

FIG. 1 shows a method whereby an electronic part 5 such as a semiconductor device is flip chip mounted on a mounting substrate 1 in the related art. As shown in FIG. 2, a plurality of solder balls 8 is formed on a part substrate 6 of the electronic part 5. Corresponding to this, a plurality of substrate side lands 2 is formed on the mounting substrate 1. For the sake of convenience of explanation, a situation where the single substrate side land 2 is formed on the mounting substrate 1 and the single solder ball 8 is formed on the electronic part 5 is shown in FIG. 1, and explanation thereof is provided.

In order to mount the electronic part 5 on the mounting plate 1, the mounting plate 1 where the substrate side land 2 is formed as shown in FIG. 1-(A) is prepared. The solder paste is arranged on the mounting plate 1 by using a thick film printing method (screen printing method). The solder paste 3 is formed by mixing a powder state solder and flux. The solder paste 3 is in a uniform paste state.

More specifically, as shown in FIG. 1-(B), a screen for printing having a pattern 12 corresponding to a configuration of the solder paste 3 is arranged at an upper part of the mounting substrate 1. The solder paste 3 is installed into the pattern 12 by using a squeegee (not shown in FIG. 1). After that, the screen 11 for printing is removed from the mounting plate 1 and thereby, as shown in FIG. 1-(C), the solder paste 2 is arranged (applied) on the substrate side land 2.

Next, as shown in FIG. 1-(D) and FIG. 2, the solder ball 8 is positioned so as to face to the solder paste 3. The electronic part 5 moves down to the mounting plate 1 so that the solder ball 8 is mounted on and provisionally fixed to the solder paste 3. Next, the mounting plate 1 where the electronic part 5 is provisionally fixed is inserted into a reflow furnace so that a heating process is done. By the heating process, the powder state solder in the solder paste 3 and the solder ball 8 are made molten and the flux in the solder paste 3 is vaporized.

Because of this, the solder in the solder paste 3 and the solder ball 8 are unified. This unified solder is called a connection solder 9. As shown in FIG. 1-(E), the substrate side land 2 and the part side land 7 are connected by the connection solder 9. Therefore, the mounting substrate 1 and the electronic part 5 are electrically and mechanically connected.

As described above, in the case where the electric part 5 is mounted on the mounting substrate 1, the solder paste 3 is arranged on the substrate land 2 of the mounting substrate 1 in this related art. It is normal to use the screen printing method wherein the screen 11 for printing is used, as described above, to mount and arrange the solder paste 3 on the substrate side land 2. However, in this case, moisture and air may be mixed in the solder paste 3 at the time of screen printing. Furthermore, the moisture may be included in the flux included in the solder paste. The moisture or air is expanded at the time of heating such as the reflow process so that the volume of the moisture or air increases. The moisture or air whose volume is expanded is called a void.

However, since the amount of the moisture or air mixed in the solder paste 8 or the flux is very small, the void may not be a problem in the conventional art wherein making the solder ball fine and making the pitch between the solder balls narrow are not so greatly required and the volume of the solder ball (the connection solder 9) is large. However, since the ball 8 is being made fine recently and continuing, the ratio of the volume of the void 10 to the volume of the connection solder 9 may relatively increase.

FIG. 3 shows an example where the ratio of the volume of the void 10 to the volume of the connection solder 9 increases. In the example shown in FIG. 3, the void 10 in the connection solder 9 is made big, so that an area where the connection solder 9 and the substrate side land 2 is connected is only an area shown by an arrow A in FIG. 3. If the volume of the void 10 occupied in the connection solder 9 increases, an electric characteristic and the mechanical connection strength of the solder paste 9 and the substrate side land 2 (or the part side land 7) is degraded. In a worst case, a problem of solder poor connection (open failure) may happen so that reliability of the solder connection may be degraded.

An X-ray may be used for viewing the electronic part 5 connected to the mounting substrate 1 from the plane, as a method for detecting a generation of the void 10. However, it is difficult to view the void 10 by X-ray imaging. Furthermore, since the void 10 is situated at a lower part of the part side land 7 made of metal, the part side land 7 is an obstacle for the X-ray imaging and therefore it is further difficult to detect the void 10.

In addition, recently and continuing, a solder having no lead (lead free solder) is frequently used as one of measures to alleviate an environmental problem. More specifically, Sn—Ag—Cu solder (melting point: 217° C.) which has a melting point higher than a melting point of a conventional Sn—Pb eutectic solder (melting point: 183° C.) is frequently used for the solder ball 8.

On the other hand, due to a heat-resisting problem of the electronic part 5, it is difficult to make a soldering temperature profile have a high temperature. It is normal to make the soldering temperature profile have a peak temperature which is 10-20° C. higher than the melting point. (The conventional Sn—Pb eutectic solder can maintain 30° C. higher than the melting point.) Making the soldering temperature profile have a high temperature, changing from the flux in the solder paste to a solvent having a high boiling point, and others, cause a delay of the flow of solder at the time of solder connection.

Because of this, the amount of the generated void 10 discharged to outside of the connection solder 9 is made small so that the amount of the void 10 remaining in the connection solder 9 increases. As a result of this, the volume of the void 10 in the connection solder 9 increases and therefore the reliability of the solder connection may be degraded.

SUMMARY OF THE INVENTION

Accordingly, it is a general object of the present invention to provide a novel and useful mounting substrate and mounting method of an electric part.

Another and more specific object of the present invention is to provide a mounting substrate and a mounting method of an electronic part wherein it is possible to prevent a void from remaining in a melt-capable connection member after an electronic part is connected.

The above object of the present invention is achieved by a mounting substrate, including:
a land connected to an electrode of an electronic part by a melt-capable connection member; and
a connection member flow-generation part configured to generate a flow at the molten melt-capable connection member.

The above object of the present invention is achieved by a mounting substrate, including:
a land connected to an electrode of an electronic part by a melt-capable connection member; and
connection member flow-generation means for generating a flow at the molten melt-capable connection member.

According to the above-mentioned inventions, when the melt-capable connection member is heated and made molten, the flow is generated at the melt-capable connection member made molten by the connection member flow-generation part. The void due to moisture and air mixed in the melt-capable connection member is moved by the flow of the melt-capable connection member from an inside to an outside of the melt-capable connection member. Because of this, the void can be prevented from remaining in the melt-capable connection member so that connection reliability can be improved.

The connection member flow-generation part may be made of a metal member formed on the land so as to be embedded in the melt-capable connection member,
the metal member may have a wettability smaller than a wettability of the land, and
the metal member may have a height shorter than a height of the melt-capable connection member in a state prior to the melt-capable connection member being heated.

The connection member flow-generation means may be made of a metal member formed on the land so as to be embedded in the melt-capable connection member,
the metal member may have a wettability smaller than a wettability of the land, and
the metal member may have a height shorter than a height of the melt-capable connection member in a state prior to the melt-capable connection member being heated.

According to the above-mentioned inventions, the metal member is arranged as the connection member flow-generation part and the metal member has the wettability smaller than the wettability of the land and has the height shorter than the height of the melt-capable connection member. Therefore, in a case where the melt-capable connection member is made molten by heating, the melt-capable connection member immediately flows from a high position of the metal member to a lower position where the land is situated. That is, since the metal member has the wettability smaller than the wettability of the land, the molten melt-capable connection member flows to the land without adhering to the metal member. Furthermore, since the metal member has the height shorter than the height of the melt-capable connection member, the metal member does not become an obstacle to arranging the melt-capable connection member on the land.

The connection member flow-generation part may be made of rosin formed on the land so as to be embedded in the melt-capable connection member, and
the rosin may have a melting temperature lower than a melting temperature of the melt-capable connection member.

The connection member flow-generation means may be made of rosin formed on the land so as to be embedded in the melt-capable connection member, and
the rosin may have a melting temperature lower than a melting temperature of the melt-capable connection member.

According to the above-mentioned inventions, the connection member flow-generation part is made of the rosin formed on the land and having the melting temperature lower than the melting temperature (liquid-phase temperature) of the melt-capable connection member. Therefore, the rosin is made molten first, and then the melt-capable connection member is made molten. Furthermore, since the rosin is formed so as to be embedded in the melt-capable connection member, the melt-capable connection member is molten in a state where the molten rosin exists in an inside of the melt-capable connection member. Since a cohesive force between molecules of the melt-capable connection member at the time of melting is larger than a cohesive force between the melt-capable connection member and the rosin, a force to push the rosin to the outside due to a difference of the cohesive forces is generated and thereby a flow is generated at the molten melt-capable connection member. The void is moved by the flow of the melt-capable connection member from an inside to an outside of the melt-capable connection member. Because of this, the void can be prevented from remaining in the melt-capable connection member so that connection reliability can be improved.

The connection member flow-generation part may be made of a metal film formed on the land,
the metal film may have a wettability smaller than a wettability of the land, and
the metal film may have an area smaller than an area of the land.

The connection member flow-generation means may be made of a metal film formed on the land,
the metal film may have a wettability smaller than a wettability of the land, and
the metal film may have an area smaller than an area of the land.

According to the above-mentioned inventions, the metal film having the wettability smaller than the wettability of the land and having the area smaller than the area of the land is provided on the land as the connection member flow-generation part. Therefore, when the melt-capable connection member is made molten by heating, the melt-capable connection member melted on the metal film flows toward the land having the higher wettability. The void is moved by the flow of the melt-capable connection member from an inside to an outside of the melt-capable connection member. Because of this, the void can be prevented from remaining in the melt-capable connection member so that connection reliability can be improved.

The connection member flow-generation part may be made of a land having a configuration different from a configuration of the melt-capable connection member.

The connection member flow-generation means may be made of a land having a configuration different from a configuration of the melt-capable connection member.

According to the above-mentioned invention, the land having the configuration different from the configuration of the melt-capable connection member provided on the land is arranged. Hence, an area of the land situated (exposed) at an outer periphery part of the melt-capable connection member becomes uneven and thereby a difference is generated for a speed of wet-spreading of the melt-capable connection member on the land. Due to the difference of the speed of wet-spreading of the melt-capable connection member, an irregular flow is generated at the melt-capable connection member so that the flow of the void in the melt-capable connection member can be activated. Because of this, the void remaining in the melt-capable connection member can be effectively discharged to an outside.

A resist member may be arranged at a place other than at least a place where the land is formed, of the substrate, and
the connection member flow-generation part may be made of a notch part formed by making a groove at the solder resist so as to be continuously formed extending toward an outside from the land.

A resist member may be arranged at a place other than at least a place where the land is formed, of the substrate, and
the connection member flow-generation means may be made of a notch part formed by making a groove at the solder resist so as to be continuously formed extending toward an outside from the land.

According to the above-mentioned invention, a notch part is formed as the connection member flow-generation part so as to be continuously formed extending toward the outside from the land on the solder resist on the substrate. Therefore, it is possible to make a difference of the speeds of wet-spreading of the melt-capable connection member at a position where the notch part is formed and a position where the notch part is not formed. Due to the difference of the speed of wet-spread of the melt-capable connection member, an irregular flow is generated at the melt-capable connection member so that the flow of the void in the melt-capable connection member can be activated. Because of this, the void remaining in the melt-capable connection member can be effectively discharged to the outside.

The connection member flow-generation part may be formed at the melt-capable connection member arranged on the land, and
the connection member flow-generation part may be made of a slit forming part having a width of equal to or more than 10% and less than 50% of a diameter of the melt-capable connection member.

The connection member flow-generation means may be formed at the melt-capable connection member arranged on the land, and
the connection member flow-generation means may be made of a slit forming part having a width of equal to or more than 10% and less than 50% of a diameter of the melt-capable connection member.

According to the above-mentioned invention, the slit forming part is formed at the melt-capable connection member. Therefore, when the melt-capable connection member is melted by heating, the molten melt-capable connection member flows toward the slit-forming part. Therefore, the void is moved by the flow of the melt-capable connection member from the inside to the outside of the melt-capable connection member. Because of this, the void can be prevented from remaining in the melt-capable connection member so that connection reliability can be improved. In this case, when the slit forming part has the width of less than 10% of the diameter of the melt-capable connection member, a sufficient solder flow is not generated at the time of melting. When the slit forming part has the width of equal to or more than 50% of the diameter of the melt-capable connection member, connection strength between an electrode of the electric part and the land of the substrate becomes weak.

The above object of the present invention is achieved by a mounting method of an electronic part, including the steps of:
arranging rosin so as to cover an outside connection terminal of the electronic part; and
connecting a bump covered by the rosin to a land of a mounting plate by a melt-capable connection member, so that the electronic part is connected to the land by the melt-capable connection member.

Under the structure, when the melt-capable connection member is connected to the land, first the rosin is mixed into the melt-capable connection member, which is made molten on the land. A cohesive force of the melt-capable connection member at the time of melting is larger than a cohesive force between the melt-capable connection member and the rosin. Therefore, due to the difference of these cohesive forces, a force to push out the rosin from the melt-capable connection member is generated and thereby a flow is generated in the melt-capable connection member. The void is moved by the flow of the melt-capable connection member to the outside of the melt-capable connection member. Because of this, the void can be prevented from remaining in the melt-capable connection member so that connection reliability can be improved.

The above object of the present invention is achieved by a mounting method of an electronic part, including a step of:
arranging a melt-capable connection member at a land of a mounting plate, in a state where a center of an arrangement position of the melt-capable connection member is shifted from a center of the land, so that the electronic part is connected to the land by the melt-capable connection member.

An amount of the shift between the center of the arrangement position of the melt-capable connection member and the center of the land may be equal to or more than 100 μm and equal to or less than 250 μm.

According to the above-mentioned inventions, when the solder in the paste is made molten by heating, a flow of the solder toward the land having a high wettability is generated. The void is moved by the flow of the solder from the inside of the solder to the outside of the solder. Because of this, the void can be prevented from remaining in the solder so that connection reliability of the solder can be improved.

The above object of the present invention is achieved by a mounting method of an electronic part, including the steps of:
starting a process for connecting a melt-capable connection member to a land of a mounting substrate in a state where a center of an arrangement position of the melt-capable connection member is shifted from a center of an outside connection terminal in advance, so that the electronic part is connected to the land by the melt-capable connection member.

An amount of the shift between the center of the arrangement position of the melt-capable connection member and the center of the land may be equal to or more than 80 μm and equal to or less than 200 μm.

According to the above-mentioned inventions, the molten melt-capable connection member moves to a position where a balance is obtained. The void is moved by the flow of the melt-capable connection member which is formed with the movement of the molten melt-capable connection member, from the inside to the outside of the solder. Because of this, the void can be prevented from remaining in the melt-capable connection member so that connection reliability can be improved.

Other objects, features, and advantages of the present invention will become more apparent from the following detailed description when read in conjunction with the accompanying drawings.

DETAILED DESCRIPTION OF THE PREFERED EMBODIMENTS

A description is given below, with reference to the FIG. 4 through FIG. 19 of embodiments of the present invention.

Figure 4:
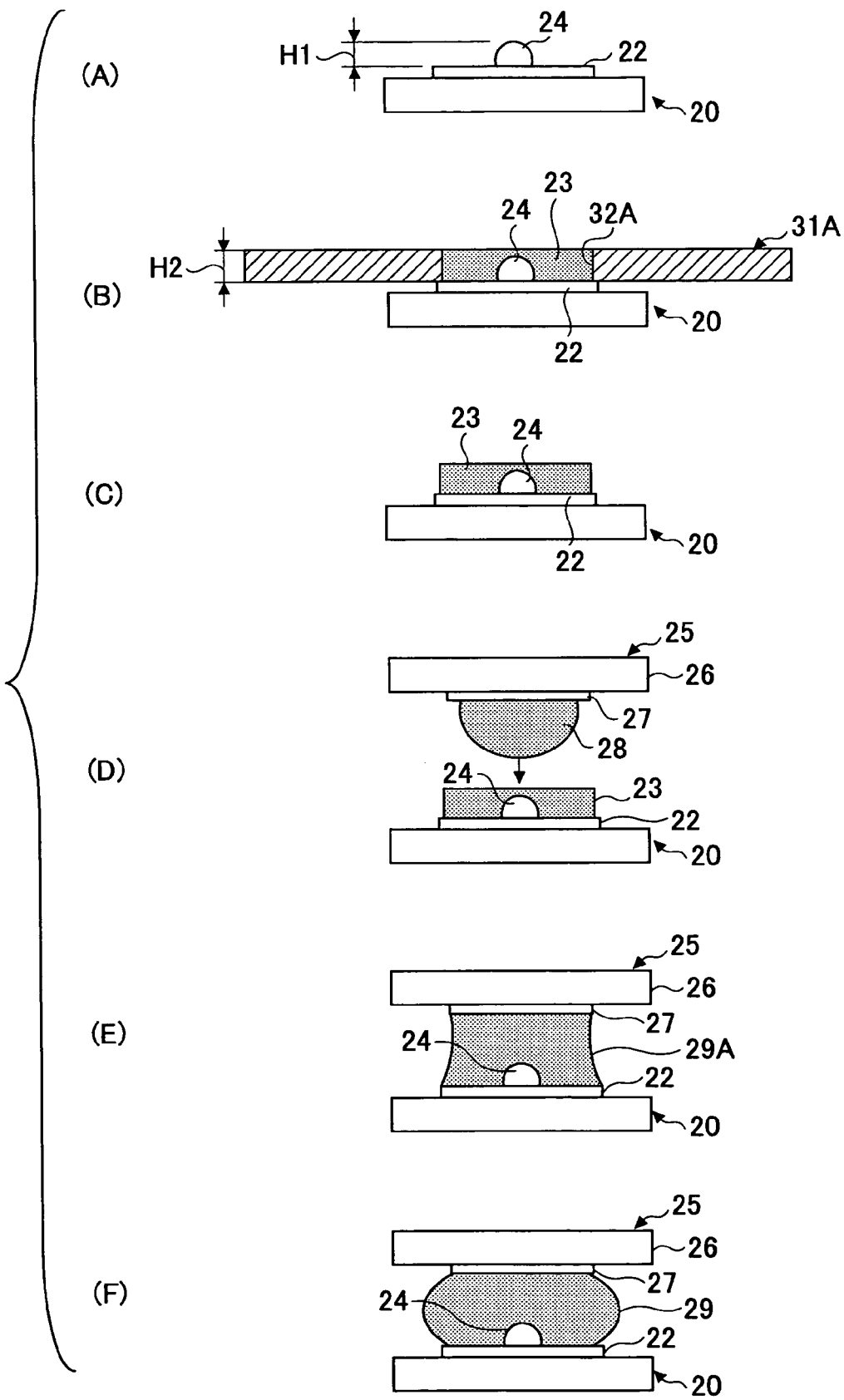
FIG. 4 is a process view for explaining a first embodiment of the present invention.

FIG. 4 is a process view for explaining a first embodiment of the present invention. FIG. 4 shows a method for connecting an electronic part 25 to a mounting substrate 20 by using a melt-capable connection member. In the below embodiments, solder is used as an example of the melt-capable connection member. The melt-capable connection member of the present invention is a melt-capable material having conductivity and functions for connecting an electrode of the electronic part and a land of the mounting substrate. The solder (Sn—Pb eutectic solder, lead free solder such as Sn—Ag—Cu solder, a solder paste, or the like), resin where a metal such as Sn, Au, Ag, and others, a solder material, or a conductive metal powder is mixed, or the like, can be used as a concrete material of the melt-capable connection member.

As shown in FIG. 4-(D), the electronic part 25 is a semiconductor device, for example. The electronic part 25 has a structure where a solder ball 28 is formed on a part side land 27 on a surface of a part substrate 26. The mounting substrate 20 is a printed circuit board and a substrate side land 22 is formed on a surface of the mounting substrate 20. The mounting substrate 20 is provided in inside of a main body part 51 or a cover body part 52 of a mobile terminal device 50 shown in FIG. 19, for example.

Figure 2:
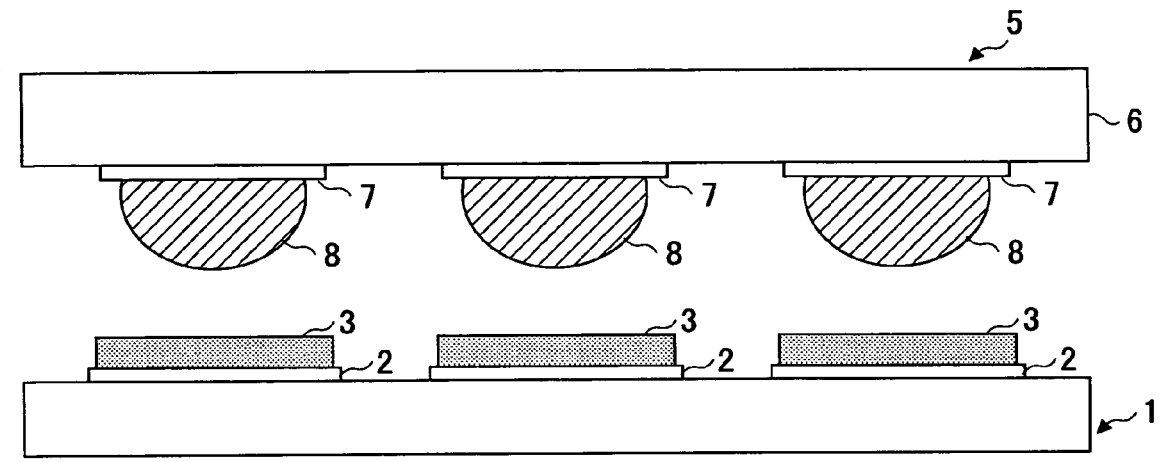
FIG. 2 is a side view for showing a state where a solder paste faces a solder ball in the related art connecting method of solder.
Figure 3:
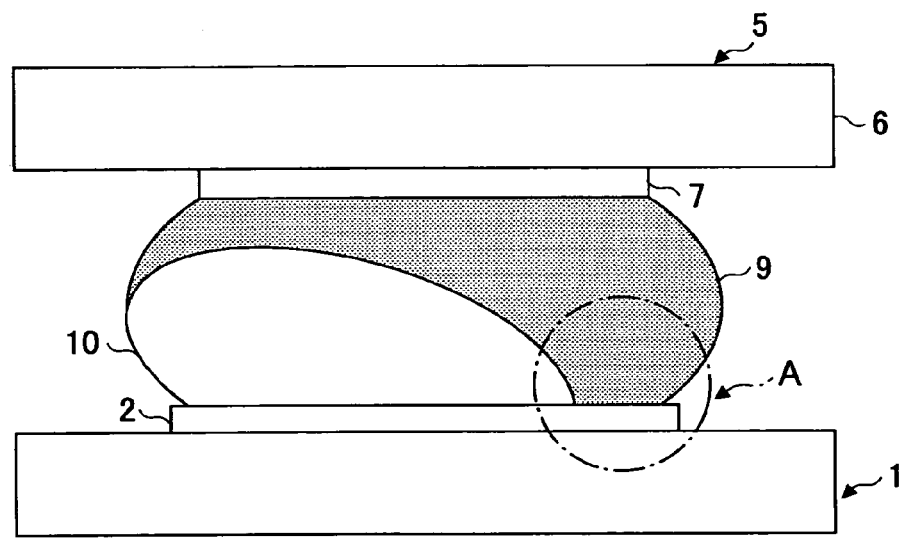
FIG. 3 is a side view for showing a problem happening in the related art connecting method of solder.

Normally, a plurality of the solder balls 28 is formed at the electronic part 25 (See FIG. 2) and a plurality of the substrate side lands 22 is formed at the mounting substrate 20 as corresponding to this. For the sake of convenience of explanation, a situation where the single substrate side land 22 is formed on the mounting substrate 20 and the single solder ball 28 is formed on the electronic part 25 is shown in FIG. 4, and explanation thereof is discussed. Although a solder resist is formed on a surface of the mounting substrate 20 except for a position where the substrate land 22 is formed, showing the solder resist is omitted in FIG. 4.

In order to mount the electronic part 25 on the mounting substrate 20, the mounting substrate 20 where the substrate side land 22 is formed as shown in FIG. 4-(A) is prepared. Next, a metal member 24 is formed at a substantially center part of the substrate side land 22. This metal member 24 is formed by a material having a wettability lower than a material of the substrate side land 22. For example, when Cu is used for the substrate side land 22, Sn, Ag, Bi, or the like (not limited to these materials) can be selected as a material of the metal member 24.

The metal member 24 is formed at a substantially center part of the substrate side land 22 so as to project to an upper side and have a height of 60-80 μm, for example. For example, a soldering method is used as a method for forming the metal member 24. Furthermore, the metal member 24 can be adhered and fixed on the substrate side land 22 by using resin (adhesion) having a melting point higher than a reflow temperature described below. In addition, the height of the metal member 24 (shown by an arrow Hi in FIG. 4-(A)) is set so as to be less than the width of a screen 31A for printing (shown by an arrow H2 in FIG. 4-(B)) which is explained below (H1<H2).

After the metal member 24 is formed on the substrate land 22 as described above, the solder paste 23 is arranged on the substrate side land 22 by using a thick film printing method (screen printing method). The solder paste 23 is formed by mixing a powder state solder and flux. The solder paste 3 is in a uniform paste state.

More specifically, as shown in FIG. 4-(B), a screen 31A for printing having a pattern 32A corresponding to a configuration of the solder paste 23 is arranged at an upper part of the mounting substrate 20. The solder paste 23 is installed into the pattern 32A by using a squeegee (not shown in FIG. 4). After that, the screen 31A for printing is removed from the mounting plate 20 and thereby, as shown in FIG. 4-(C), the solder paste 23 is arranged (applied) on the substrate side land 22 of the mounting substrate 20.

In this case, as described above, since the height Hi of the metal member 24 is less than the width H2 of the screen 30A for printing, the metal member 24 does not obstruct the screen printing of the solder paste 23. Furthermore, at the time of the screen printing, as described above, moisture or air may be included in the solder paste 23.

After the solder paste 23 is arranged, as shown in FIG. 4-(D), the solder ball 28 is positioned so as to face the solder paste 23. The electronic part 25 is moved down to the mounting plate 20 so that the solder ball 28 is mounted on and provisionally fixed to the solder paste 23. Next, the mounting plate 20 where the electronic part 25 is provisionally fixed is inserted into a reflow furnace so that a heating process is done. By the heating process, the powder state solder in the solder paste 23 and the solder ball 28 are made molten and the flux in the solder paste 23 is vaporized.

Figure 5:
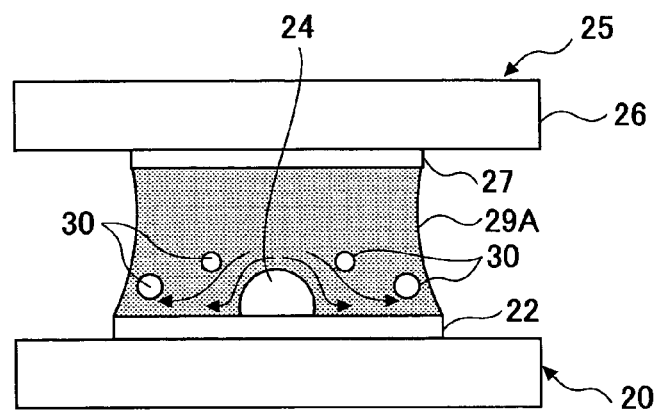
FIG. 5 is a cross-sectional view for explaining the reason why a void is discharged in the first embodiment of the present invention.

FIG. 4-(E) and FIG. 5 shows states where the powder state solder in the solder paste 23 and the solder ball 28 are melted so as to be in a body. A solder in this molting state is called a molten solder 29A hereinafter. As described above, moisture and air may be included in the solder paste 23 at the time of screen printing. If moisture and air are included in the solder paste 23 and the solder in the solder paste 23 and the solder ball 28 are melted, the moisture and air are expanded so as to become a void 30. The void 30 lies in the molten solder 29A.

In this embodiment, metal member 24 is formed projecting at the substantially center part of substrate side land 22. Therefore, the molten solder 29A comes in contact with the metal member 24. In this case, as described above, since the metal member 24 has low wettability with the molten solder 29A, the molten solder 29A is shed at a surface of the metal member 24. This situation is similar to oil paper shedding water.

Furthermore, the metal member 24 is formed projecting on the substrate side land 22 and the height of the metal member 24 is set so as to be the maximum height that does not obstruct the screen printing. Therefore, the molten solder 29A shed by the metal member 24 flows down along the metal member 24. The flow of the molten solder 29A is shown by arrows in FIG. 5. That is, the metal member 24 functions as a connection member flow-generation part configured to generate a flow of the molten molds 29A.

Thus, in this embodiment, the molten solder 29A immediately flows from a high position to a lower position of the metal member 24. Hence, the void 30 moves from a high position to a lower position by this flow so as to be discharged from the molten solder 29A. Because of this, as shown in FIG. 4-(F), when the reflow process is completed and the molten solder 29A is cooled so that the connection solder 29 is formed, the void 30 does not remain in the connection solder 29. Hence, it is possible to achieve a precise solder connection and thereby the mounting plate 20 and the electronic part 25 can be electrically and mechanically connected with high reliability.

Through an experiment of the present invention, the following was confirmed. That is, even if the conventional Sn—Pb eutectic solder or the lead free solder having a melting point higher than the melting point of the conventional Sn—Pb eutectic solder is used as the solder ball 28 and the solder powder of the solder paste 23, it is possible to generate a flow of the molten solder at the time of solder melting and prevent the void from being generated, by this embodiment.

Figure 6:
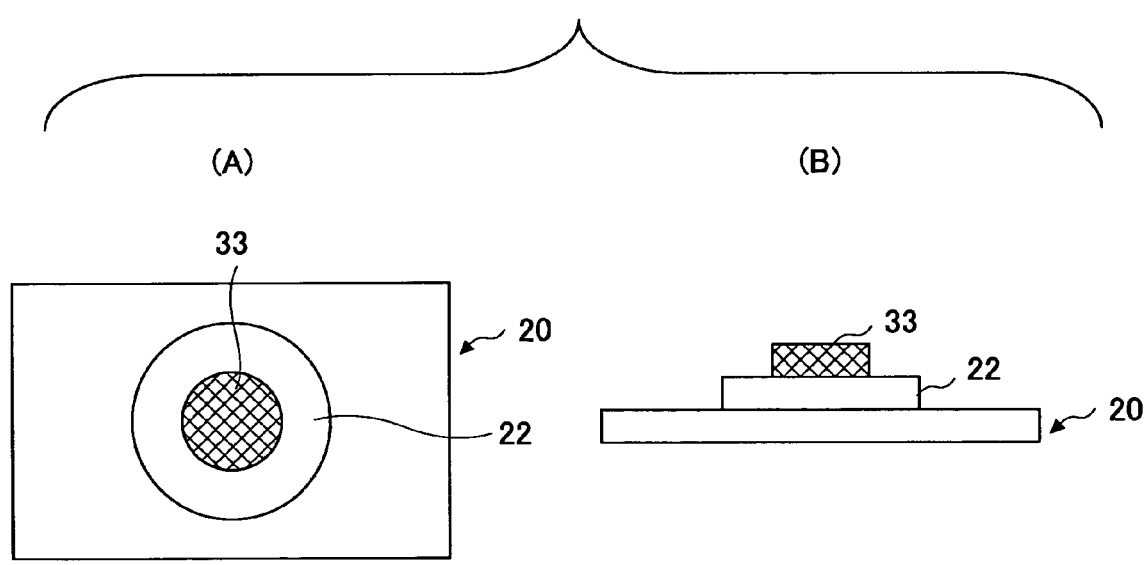
FIG. 6 is a plan view and a side view for explaining a second embodiment of the present invention.

FIG. 6 shows a second embodiment of the present invention.

In FIG. 6 and FIGS. 7 through 18 which are used for explaining other embodiments, parts that are the same as the parts shown in FIGS. 4 and 5 are given the same reference numerals, and explanation thereof is omitted.

In the above-discussed first embodiment, the metal member 24 is used as the connection member flow generation part configured to make a flow at the molten solder 29A. On the other hand, in the second embodiment, a metal film 33 is provided as the connection member flow generation part configured to make a flow at the molten solder 29A. The metal film 33 is formed on the substrate side land 22 by using a plating method or a thin film forming technology such as a vaporization method.

This metal film 23, as well as metal member 24, is formed by a material having a wettability lower than a material of the substrate side land 22. For example, when Cu is used for the substrate side land 22, Sn, Ag, Bi, or the like (not limited to these materials) can be selected as a material of the metal member 24. The area of the metal film 23 is smaller than the area of the substrate side land 22. The substrate side land 22 is formed so as to surround the outer periphery of the metal film 33 in a state where the metal film 33 is formed on the substrate side land 22.

Figure 7:
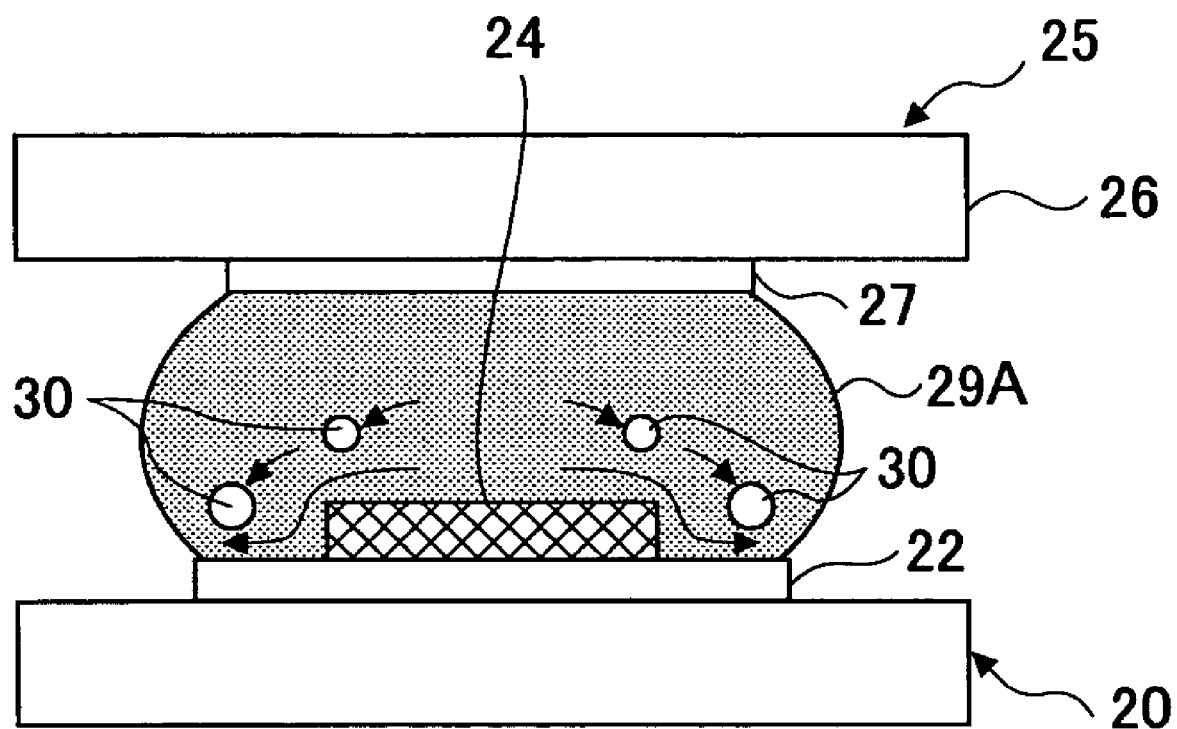
FIG. 7 is a cross-sectional view for explaining the reason why a void is discharged in the second embodiment of the present invention.

FIG. 7 shows a state where both the powder paste solder in the solder paste 23 and the solder ball 28 are made molten in the second embodiment. In the second embodiment, the metal film 33 having a wettability is formed at a substantially center position of the substrate side land 22. Hence, the molten solder 29A is shed at the surface of the metal film 33 and a flow from the center position of the metal film 33 (the substrate side land 22) to the outside is generated. The flow of the molten solder 29A is shown by arrows in FIG. 7. That is, the metal film 33 functions as connection member flow-generation part configured to generate the flow of the molten solders 29A.

Thus, in the second embodiment, the flow is from the metal film 33 to the outside, namely to position where the substrate side land 22 is exposed. Hence, the void 30 moves toward the outside of the substrate side land 22 and is discharged from the molten solder 29A to the outside. Because of this, it is possible to prevent the void 30 from remaining in the connection solder 29. Hence, it is possible to achieve a precise solder connection and thereby the mounting plate 20 and the electronic part 25 can be electrically and mechanically connected with high reliability.

Figure 8:
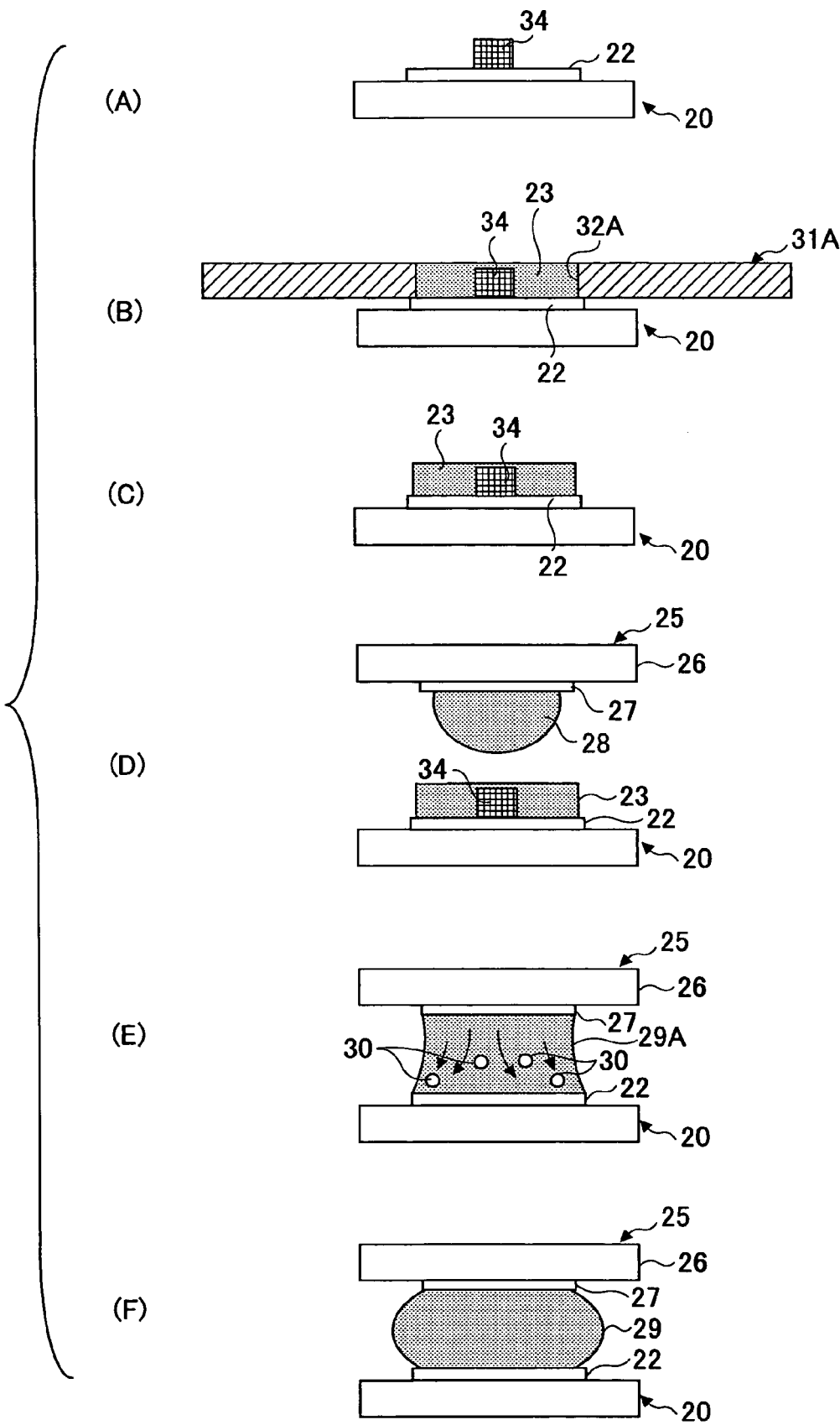
FIG. 8 is a process view for explaining a third embodiment of the present invention.

FIG. 8 shows a third embodiment of the present invention.

In the above-discussed first embodiment, the metal member 24 is used as the connection member flow generation part configured to make a flow at the molten solder 29A. On the other hand, in the third embodiment, a rosin 34 is provided as the connection member flow generation part configured to make a flow at the molten solder 29A.

The rosin 34 is resin of a tree such as a pine. The rosin has a melting point (liquid phase temperature) of approximately 90-100° C. which is lower than the melting point of the solder.

In this embodiment, in order to mount the electronic part 25 on the mounting board 20, first, as shown in FIG. 8-(A), the rosin 34 is provided on a substantially center part of the substrate side land 22 formed on the mounting board 20. In this example, the block-shaped rosin 34 is provided on the substrate side land 22. Since the rosin 34 has some degree of viscosity, the rosin 34 is provisionally fixed to the substrate side 22 by simply mounting the rosin 34 on the substrate side land 22. Although the block-shaped rosin 34 is used in this example, a film-shaped rosin 34 may be provided on an upper surface of the substrate side land 22.

After the rosin 34 is provided on the substrate side land 22, the solder paste 23 is arranged (applied) on the substrate side land 22 by using the screen printing method. Next, as shown in FIG. 8-(D), the solder ball 28 and the solder paste 23 are positioned so as to face each other and the electronic part 25 is moved down to the mounting plate 20 so that the solder ball 28 is inserted into the solder paste 23, and the mounting plate 20 and the electronic part 25 are provisionally fixed.

Next, the mounting plate 20 where the electronic part 25 is provisionally fixed is inserted into a reflow furnace so that a heating process is done. In this embodiment, by the heating process, before the powder state solder in the solder paste 23 and the solder ball 28 are made molten, the rosin 34 having a lower melting temperature starts being melted first and then the solder is melted. Furthermore, the rosin 34 is formed so as to be embedded in the solder paste 23. Therefore, when the solder is melted, the solder (solder powder) in the solder paste 23 is made molten in a state where the molten rosin 34 exists inside of the solder paste 23.

Since a cohesive force between molecules of the solders at the time of melting is larger than a cohesive force between the solder and the rosin, a force to push out the rosin 34 to the outside due to the difference of the cohesive forces is generated in the molten solder 29A and thereby a flow is generated in the molten solder 29A. The flow of the molten solder 29A is shown by arrows in FIG. 8-(E). The void 30 is moved by the flow of the molten solder 29A to the outside and discharged to the outside. Because of this, in this embodiment, the void 30 can be prevented from remaining in the molten solder 29A so that connection reliability can be improved.

Figure 9:
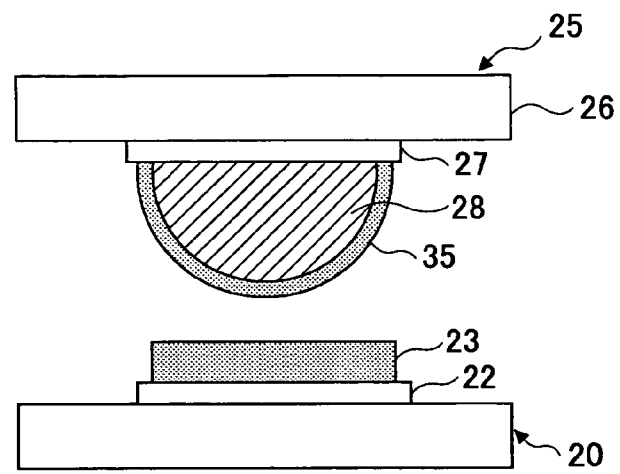
FIG. 9 is a side view for explaining a fourth embodiment of the present invention

FIG. 9 is a view for explaining the fourth embodiment of the present invention.

In the above-discussed third embodiment, the block-shaped rosin 34 is formed on the substrate side land 22. In the fourth embodiment, the rosin film 35 is arranged so as to cover the solder ball 28.

The rosin film 35 functions as a connection member flow generation part configured to generate the flow in the molten solder 29A. The rosin film 35 is made of a material the same as the rosin 34 used in the third embodiment and has a property in that a melting temperature (liquid phase temperature) of the rosin film 35 is lower than a melting point of the solder.

Therefore, in the fourth embodiment as well as the third embodiment, by the reflow heating process, before the powder state solder in the solder paste 23 and the solder ball 28 are made molten, the rosin 34 having a low melting temperature starts being melted first and then the solder is melted. As discussed above, since a cohesive force between molecules of the solders at the time of melting is larger than a cohesive force between the solder and the rosin, a force to push out the rosin 34 to the outside due to a difference of the cohesive forces is generated in the molten solder 29A and thereby a flow is generated in the molten solder 29A.

The void 30 is moved by the flow of the molten solder 29A to the outside and discharged to the outside. Because of this, in this embodiment, the void 30 can be prevented from remaining in the molten solder 29A so that connection reliability can be improved.

Figure 10:
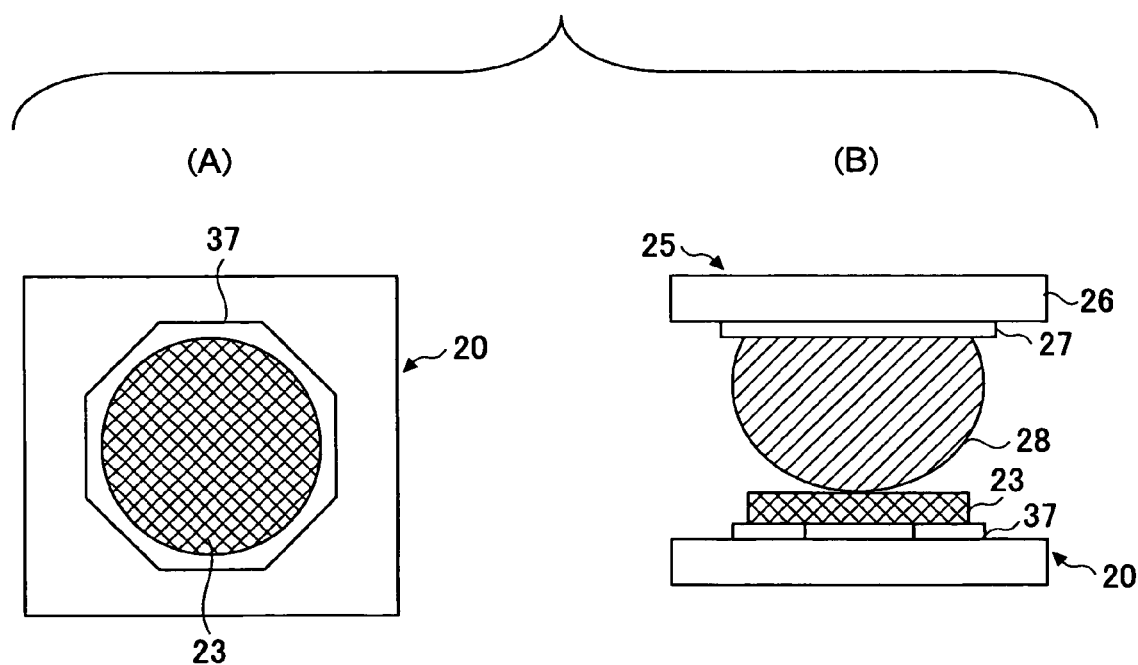
FIG. 10 is a plan view and a side view for explaining a fifth embodiment of the present invention.
Figure 11:
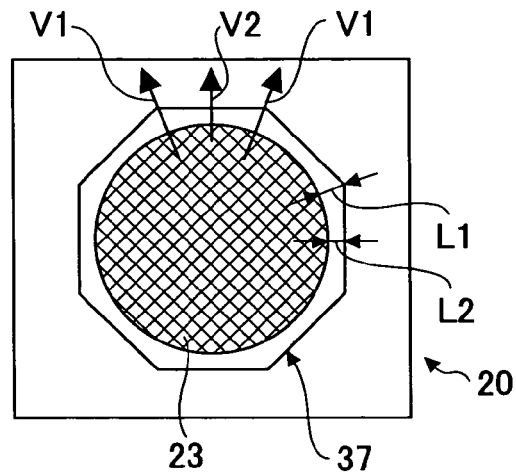
FIG. 11 is a cross-sectional view for explaining the reason why a void is discharged in the fifth embodiment of the present invention.

FIG. 10 and FIG. 11 are views for explaining the fifth embodiment of the present invention.

In the fifth embodiment, a configuration of the solder paste 23 is different from a configuration of the part side land 37 (hereinafter a modified part side land 37). In addition, areas of the modified part side land 37, situated at an outer periphery part of the solder paste 23, are different. Connection member flow generation means is formed by these structures, in the fifth embodiment.

More specifically, as shown in FIG. 10-(A) and FIG. 11, in a plan view state, the solder paste 23 has a circular-shaped configuration while the modified party side land 37 has a octagonal-shaped configuration. Under these structures, the distance between an outer periphery of the solder paste 23 and an outer periphery of the modified part side land 37 is uneven, and therefore a long distance part shown by an arrow L1 in FIG. 11 and a short distance part shown by an arrow L2 in FIG. 11 are made.

Figure 1:
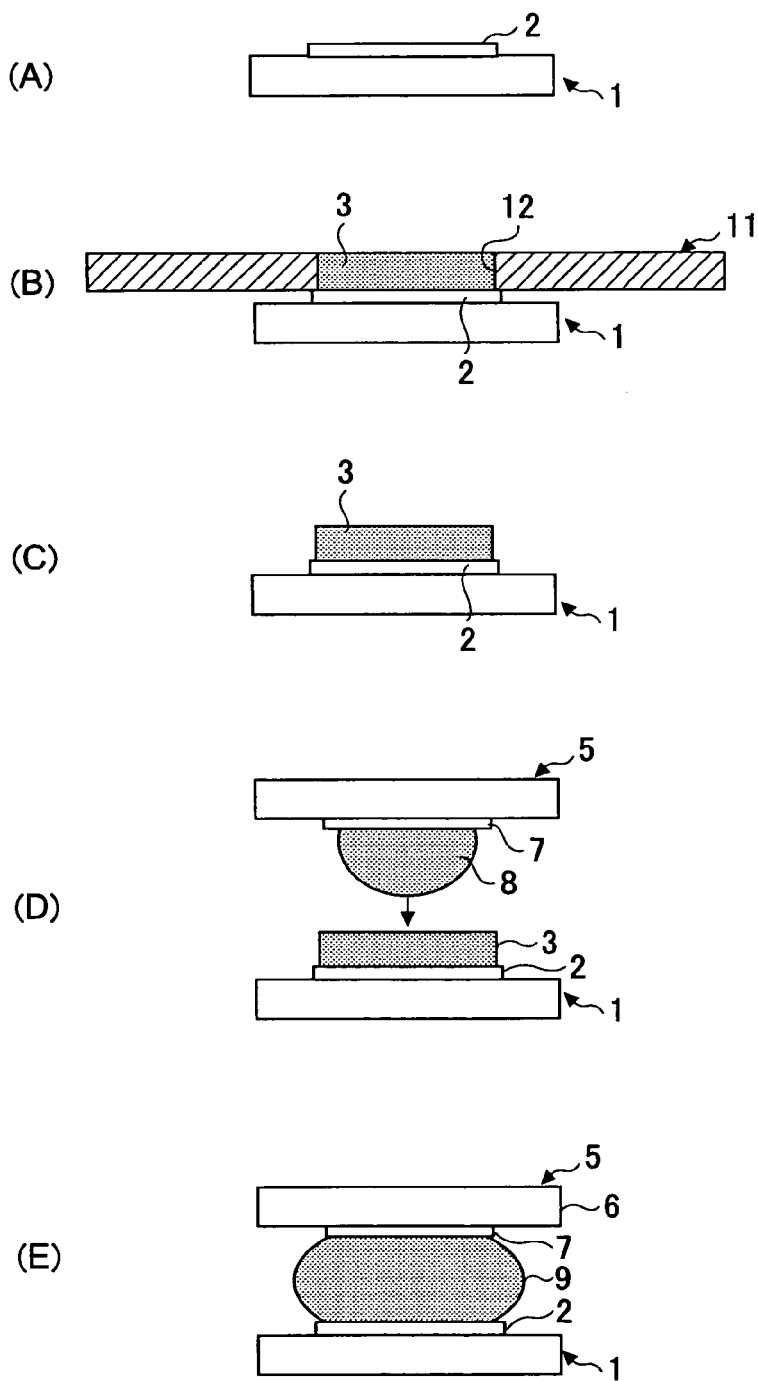
FIG. 1 is a process view for showing connecting steps of a related art connecting method of solder.

The modified part side land 37 has good wettability with solder. Therefore, in a case where the solder is made molten in the solder paste 23, the molten solder is smoothly wet-spread on the modified part side land 37. The speed for wet-spreading is interrelated to the length in a radius direction of the modified part side land 37 exposed at the outer periphery of the solder paste 23. That is, a flow speed, shown by an arrow V1 in FIG. 11, of the molten solder at the long distance part shown by the arrow L1 in FIG. 11 is higher than a flow speed, shown by an arrow V2 in FIG. 11, of the molten solder at the short distance part shown by the arrow L2 in FIG. 1.

Thus, due to the difference of the areas of the modified part side land 37 exposed at the outer periphery part of the solder paste 23, a difference of the speed of wet-spreading of the molten solder on the modified part side land 37A is generated. Due to the difference of the speed of wet-spreading of the molten solder, an irregular flow is generated at the molten solder so that the flow of the void 30 can be activated. Because of this, the void 30 remaining in the molten solder can be effectively discharged to the outside, and thereby a solder connection having high reliability can be achieved.

Figure 12:
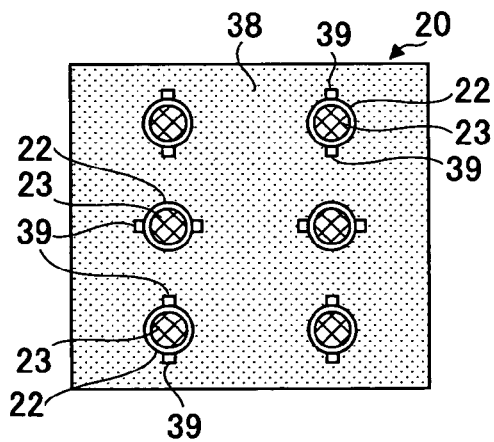
FIG. 12 is a plan view for explaining a sixth embodiment of the present invention.
Figure 12:
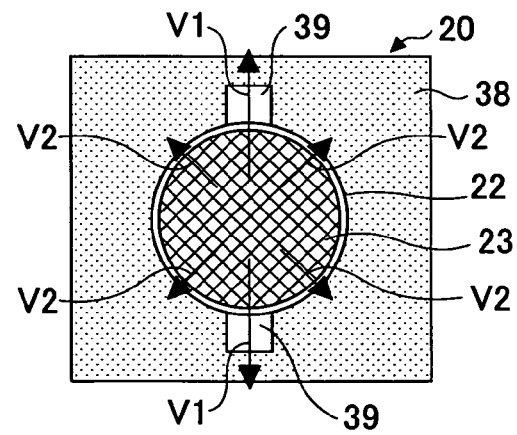

FIG. 12 is a view for explaining a sixth embodiment of the present invention.

More specifically, FIG. 12-(A) shows the mounting substrate 20 where six substrate side lands 22 are formed. FIG. 12-(B) is an enlarged view of a single substrate side land 22 of the six substrate side lands 22. In this embodiment, a solder resist 38 is arranged at a place other than at least a place where the substrate side land 22 is formed, of the mounting substrate 20. In addition, a notch part 39 is formed at the outer periphery position of the substrate side land 22. A connection member flow-generation part configured to generate the flow at the molten solder is made by these structures.

The notch part 39 is formed by making a groove at the solder resist 38. The substrate side land 22 has a structure where the solder resist 38 is removed. The substrate side land 22 and the notch part 39 are continuously formed. Furthermore, the forming direction of the notch part 39 is formed so as to extend from the outer periphery having a circular-shaped configuration, of the substrate side land 22 to the outside.

Under this structure, there is a distance from the solder resist 38 to a position where the notch part 39 is formed at the outer periphery position of the substrate side land 22 and a position where the notch part 39 is not formed at the outer periphery position of the substrate side land 22. The solder resist 38 has an effect to prevent the adhesion of the solder and therefore has low wettability against the solder. A part where the solder resist 38 is removed has a wettability higher than a part where the solder resist 38 is formed.

Therefore, in a case where the solder is made molten in the solder paste 23, a flow speed, shown by an arrow V1 in FIG. 12-(B), of the molten solder at a position where the notch part 39 is formed is higher than a flow speed, shown by an arrow V2 in FIG. 12-(B), of the molten solder at a position where the notch part 39 is not formed. That is, due to the solder resist 38 formed at the outer periphery of the solder paste 23, a difference of the speed of wet-spreading of the molten solder is generated.

Due to the difference of the speed of wet-spreading of the molten solder, an irregular solder flow is generated at the molten solder so that the flow of the void 30 can be activated. Because of this, the void 30 remaining in the molten solder can be effectively discharged to the outside, and thereby a solder connection having high reliability can be achieved.

Figure 13:
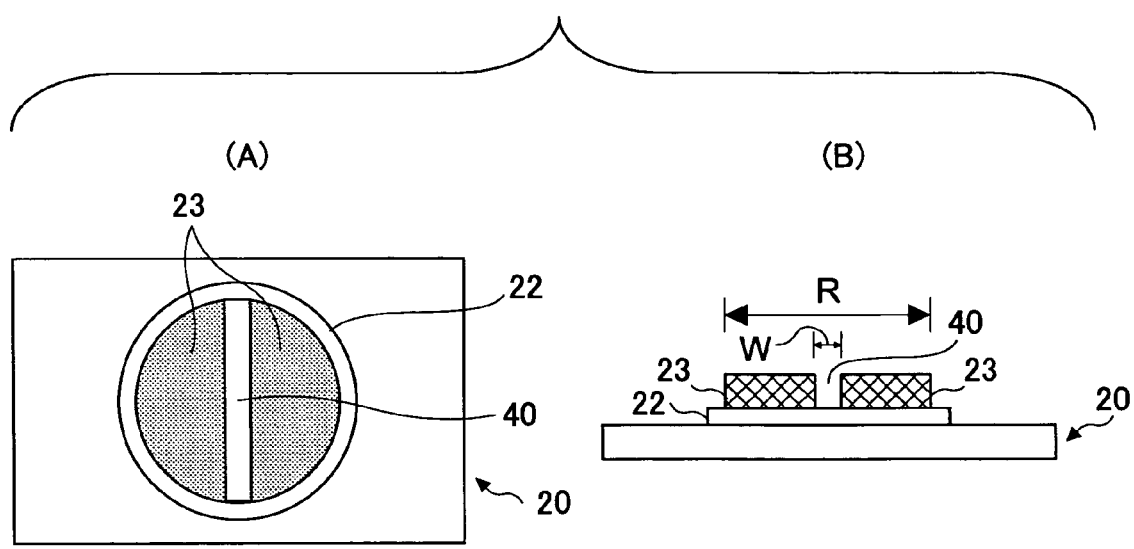
FIG. 13 is a plan view and a side view for explaining a seventh embodiment of the present invention.
Figure 14:
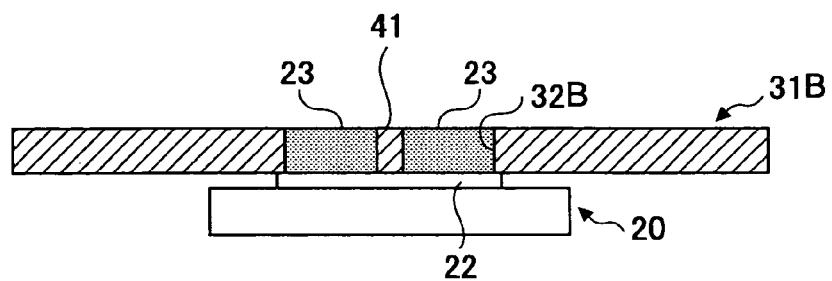
FIG. 14 is a cross-sectional view for explaining a method for forming a slit forming part in a solder paste.
Figure 15:
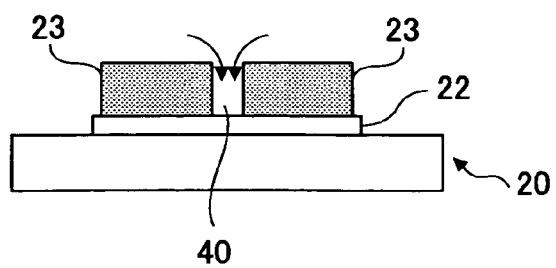
FIG. 15 is a cross-sectional view for explaining the reason why a void is discharged in the seventh embodiment of the present invention.

FIGS. 13-15 are views for explaining a seventh embodiment of the present invention. In this embodiment, when the solder paste 23 is arranged on the substrate side land 22, a slit forming part 40 is formed at the solder paste 23. The width, shown by an arrow W in FIG. 13-(B), of the slit 40 is equal to or more than 10% and less than 50% of a diameter, shown by an arrow R in FIG. 13-(B), of the solder paste 23.

Thus, in order to form the slit forming part 40 at the solder paste 23, as shown in FIG. 14, a pattern 32B having a slit formation part 41 is formed on the screen 31B for printing which is used for forming the solder paste 23 on the substrate side land 22. Because of this, the solder paste 23 is not arranged at the slit formation part 41 at the time of screen printing of the solder paste 23, and therefore the slit forming part 40 can be formed in the solder paste 23.

According to this embodiment, when the solder in the solder paste 23 is made molten by reflow heating, the molten solder flows toward to the slit-forming part 40. That is, the molten solder flows to the slit forming part 40 at the center part of the solder paste 23, as shown by arrows in FIG. 15. Therefore, the void 30 in the molten solder is moved by the flow of the molten solder from inside to the outside. Because of this, the void can be prevented from remaining in the melt-capable connection member so that connection reliability can be improved.

In this case, when the slit forming part 40 has the width W of less than 10% of the diameter R of the solder paste 23, a sufficient solder flow toward the slit forming part 40 is not generated at the time of melting. When the slit forming part 40 has the width W of equal to or more than 50% of the diameter of the diameter R of the solder paste 23, the absolute amount of the solder paste 23 is small and connection strength between the electric part 25 and the mounting substrate 20 becomes weak.

Figure 16:
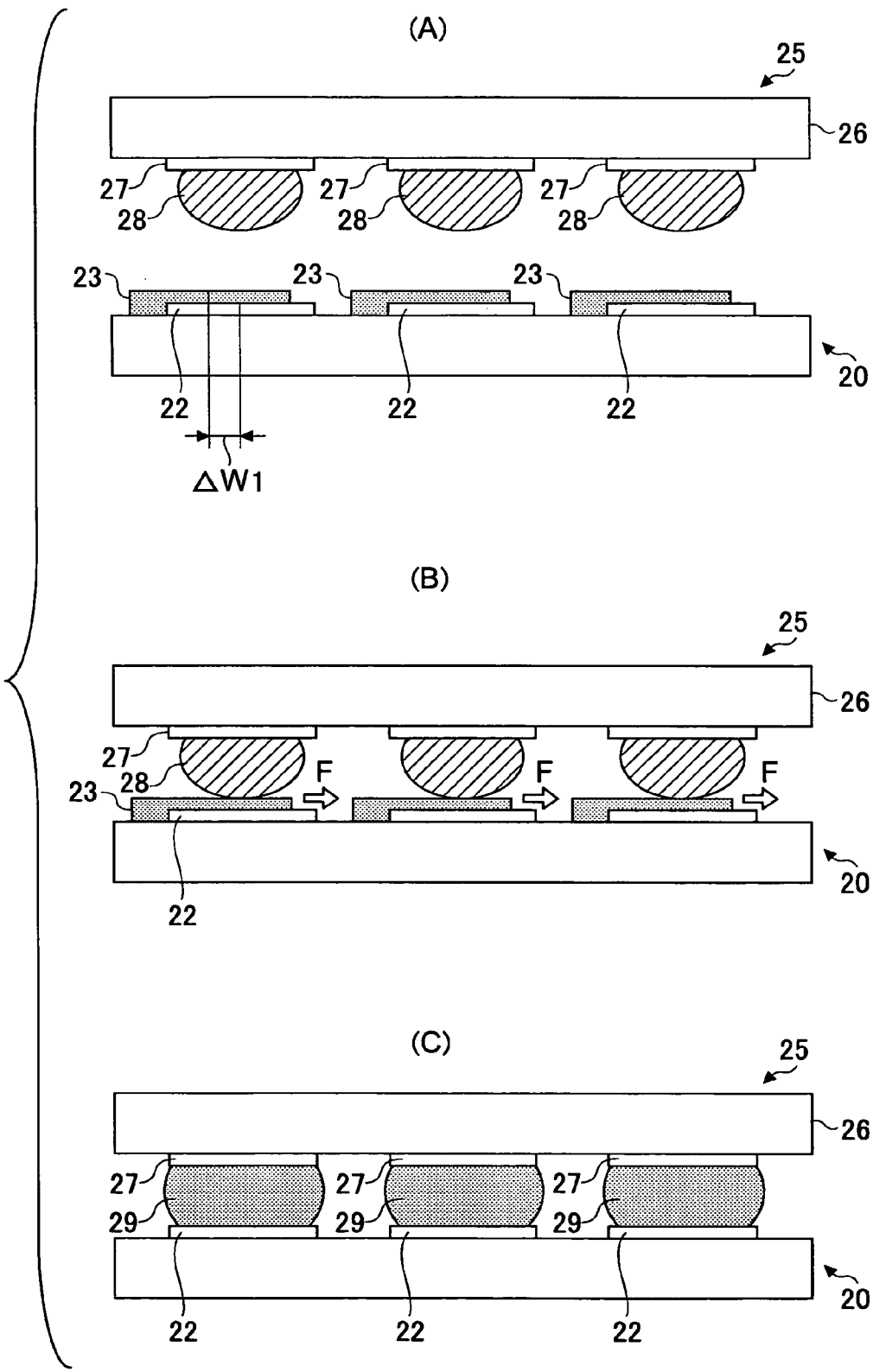
FIG. 16 is a side view for explaining an eighth embodiment of the present invention.
Figure 17:
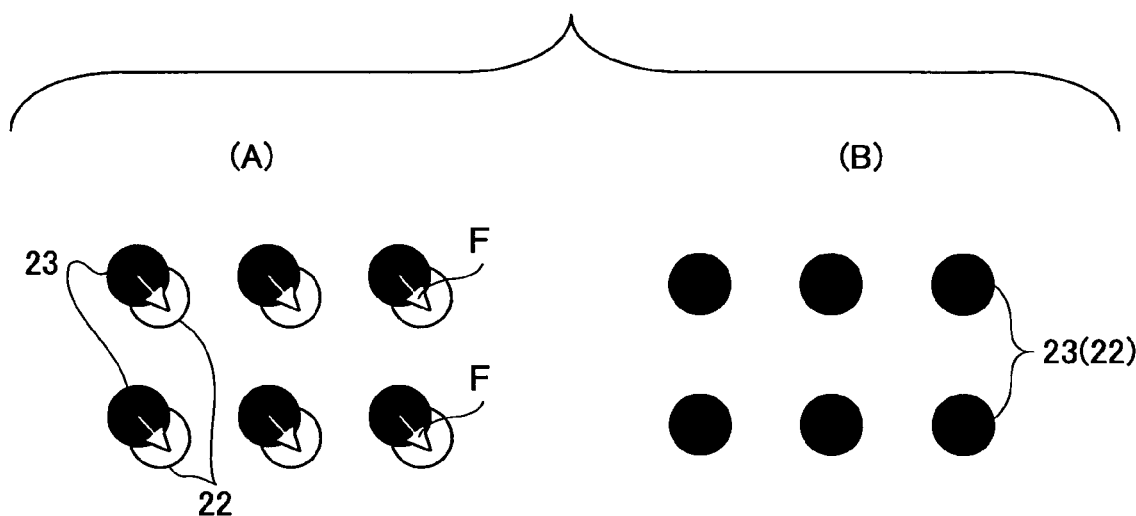
FIG. 17 is a plan view for explaining the eighth embodiment of the present invention.

FIG. 16 and FIG. 17 are views for explaining an eighth embodiment of the present invention.

In this embodiment, when the solder paste is arranged on the substrate side land 22, the center of an arrangement position of the solder paste 23 is shifted from the center of the substrate side land 23. In this example, as shown in FIG. 16-(A), the center of an arrangement position of the solder paste 23 is shifted from the center of the substrate side land 23 by $\Delta W1$.

It is possible to easily shift the solder paste 23 against the substrate side land 22 by properly adjusting the position of the screen 30A for printing against the mounting plate 20 when the solder paste 23 is formed on the substrate side land 22. See FIG. 4-(B). The amount $\Delta W1$ of the shift is changed depending on the size of the substrate side land 22 or the solder ball 28. However, in a case of the solder ball 28 corresponding to a high density mounting, it is preferable that this amount be equal to or more than 100 μm and equal to or less than 250 μm.

Thus, by shifting the center of an arrangement position of the solder paste 23 from the center of the substrate side land 22, a force for moving to the substrate side land 22 having high wettability, shown by arrows F in FIG. 16-(B) and FIG. 17-(A), hereinafter, a flow force F, is generated at the molten solder when the solder in the solder paste 23 is molted by reflow heating. Because of the flow force F, a flow of the molten solder is generated and this flow continues until all of the molten solders go to the substrate side land 22. FIG. 16-(C) and FIG. 17-(B) show a state where all of the molten solders go to the substrate side land 22.

A phenomenon, where the solder moves in a flow, wherein the solder situated at the shifted position moves by itself to the substrate side land 22 situated at a proper position, is called a self-alignment. By this self-alignment operation of the molten solder, the void 30 mixed in the molten solder is moved. Therefore, the void 30 is discharged to the outside with the flow of the molten solder and the void 30 can be prevented from remaining in the melt-capable connection member so that connection reliability can be improved.

Figure 18:
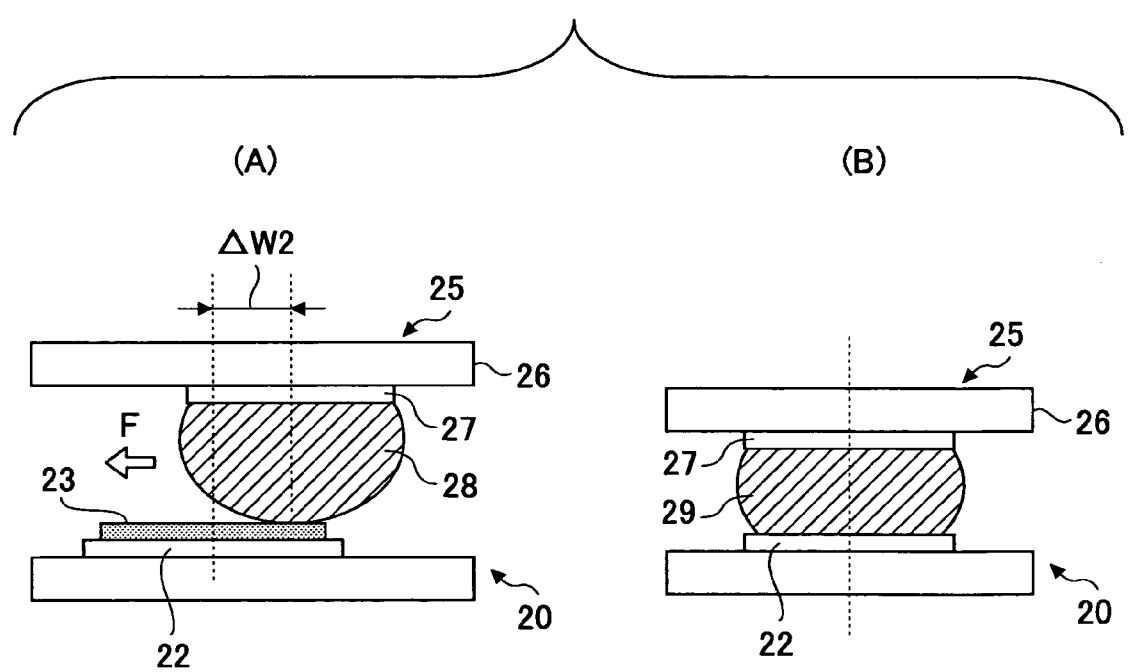
FIG. 18 is a side view for explaining a ninth embodiment of the present invention.
Figure 19:
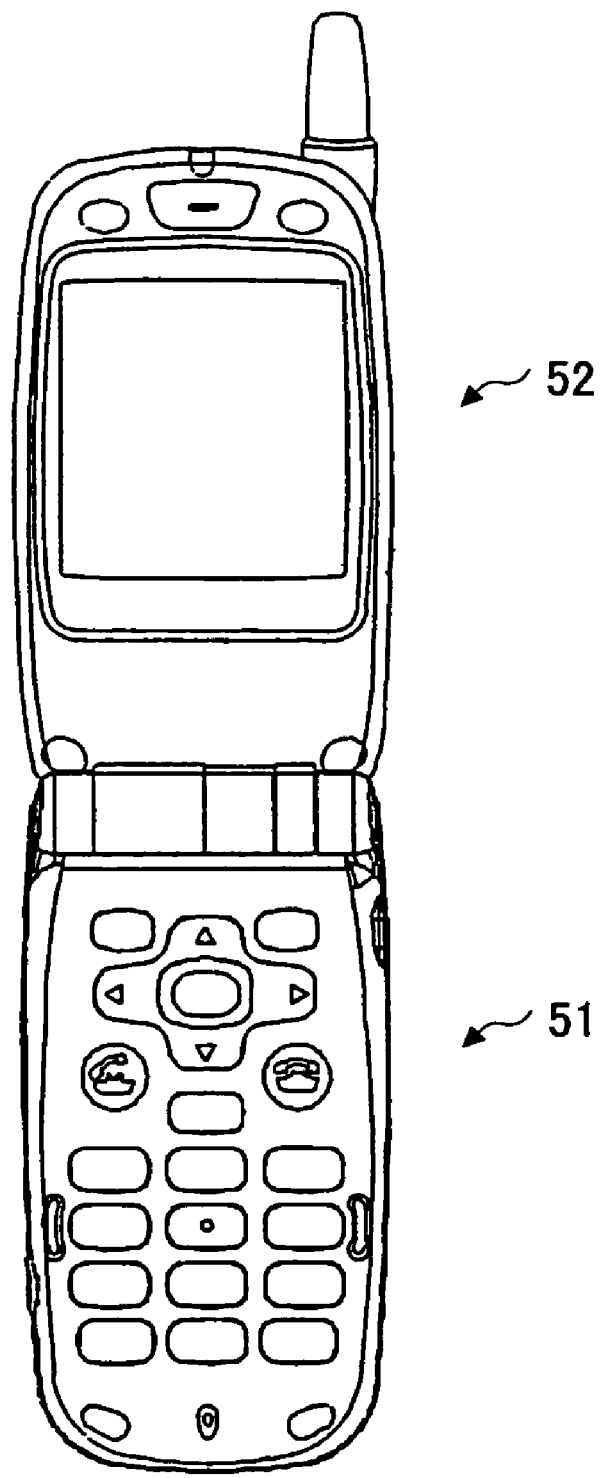
FIG. 19 is a view showing an example of a mobile terminal device where each of the embodiments of the present invention can be applied.

FIG. 18 is a view for explaining a ninth embodiment of the present invention.

In this embodiment, when the solder ball 28 is connected to the substrate side land 22 where the solder paste 23 is arranged, a connection process starts in a state where the center of an arrangement position of the solder paste 23 is shifted from the center of the solder ball 28 in advance. In this example, as shown in FIG. 18-(A), the center of the solder paste 23 is shifted from the center of the solder ball 28 by $\Delta W2$. It is possible to easily shift the solder ball 28 against the solder paste 23 by properly changing a setting of a positioning device for the electronic part 25 and the mounting plate 20. The amount $\Delta W2$ of the shift is changed depending on the size of the substrate side land 22 or the solder ball 28. However, in a case of the solder ball 28 corresponding to a high density mounting, it is preferable that this amount be equal to or more than 80 μm and equal to or less than 200 μm.

Thus, by shifting the substrate side land 22 and the center position of the solder ball 28, in this embodiment, the self-alignment is generated when the solder in the solder paste 23 is made molten by reflow heating. The self-alignment activity generated in this embodiment continues until the solder in the solder ball 28 and the solder (molten solder) in the solder paste 23 are in a most stable state (state where surface tension becomes stable). A force, hereinafter a flow force F, shown by an arrow F in FIG. 18-(A), is generated so as to move to a stable situation of the solder. A flow of the molten solder is generated by the flow force F, and, as described above, this flow continues until the molten solder has a stable configuration. FIG. 18-(B) shows a state where the configuration of the molten solder becomes stable, namely a state where the flow force F is extinguished.

The void 30 mixed in the molten solder is moved with the flow of the molten solder based on the self-alignment and discharged to the outside. Therefore, the void 30 can be prevented from remaining in the melt-capable connection member so that connection reliability can be improved.

The present invention is not limited to these embodiments, but variations and modifications may be made without departing from the scope of the present invention.

This patent application is based on Japanese Priority Patent Application No. 2004-118203 filed on Apr. 13, 2004, and the entire contents of which are hereby incorporated by reference.

What is claimed is:

1. A mounting substrate, comprising:

a land connected to an electrode of an electronic part by a melt-capable connection member; and a connection member flow-generation part configured to generate a flow at the molten melt-capable connection member, wherein the connection member flow-generation part is made of metal and is provided at a substantially center part on the land so as to project upward.

2. The mounting substrate as claimed in claim 1, wherein the connection member flow-generation part is made of a metal member formed on the land so as to be embedded in the melt-capable connection member,
the metal member has a wettability smaller than a wettability of the land, and
the metal member has a height shorter than a height of the melt-capable connection member in a state prior to the melt-capable connection member being heated.

3. The mounting substrate as claimed in claim 1, wherein the connection member flow-generation part is made of rosin formed on the land so as to be embedded in the melt-capable connection member, and
the rosin has a melting temperature lower than a melting temperature of the melt-capable connection member.

4. The mounting substrate as claimed in claim 1, wherein the connection member flow-generation part is made of a metal film formed on the land,
the metal film has a wettability smaller than a wettability of the land, and
the metal film has an area smaller than an area of the land.

5. The mounting substrate as claimed in claim 1, wherein the connection member flow-generation part is made of a land having a configuration different from a configuration of the melt-capable connection member.

6. The mounting substrate as claimed in claim 1, wherein a resist member is arranged at a place other than at least a place where the land is formed, of the substrate, and
the connection member flow-generation part is made of a notch part formed by making a groove at the solder resist so as to be continuously formed extending toward an outside from the land.

7. The mounting substrate as claimed in claim 1, wherein the connection member flow-generation part is formed at the melt-capable connection member arranged on the land, and
the connection member flow-generation part is made of a slit forming part having a width of equal to or more than 10% and less than 50% of a diameter of the melt-capable connection member.

8. A mounting substrate, comprising:
a land connected to an electrode of an electronic part by a melt-capable connection member; and
connection member flow-generation means for generating a flow at the molten melt-capable connection member,
wherein the connection member flow-generation part is made of metal and is provided at a Substantially center part on the land so as to project upward.

9. The mounting substrate as claimed in claim 8, wherein the connection member flow-generation means is made of a metal member formed on the land so as to be embedded in the melt-capable connection member,
the metal member has a wettability smaller than a wettability of the land,
and the metal member has a height shorter than a height of the melt-capable connection member in a state prior to the melt-capable connection member being heated.

10. The mounting substrate as claimed in claim 8, wherein the connection member flow-generation means is made of rosin formed on the land so as to be embedded in the melt-capable connection member, and
the rosin has a melting temperature lower than a melting temperature of the melt-capable connection member.

11. The mounting substrate as claimed in claim 8, wherein the connection member flow-generation means is made of a metal film formed on the land,
the metal film has a wettability smaller than a wettability of the land, and
the metal film has an area smaller than an area of the land.

12. The mounting substrate as claimed in claim 8, wherein the connection member flow-generation means is made of a land having a configuration different from a configuration of the melt-capable connection member.

13. The mounting substrate as claimed in claim 8, wherein a resist member is arranged at a place other than at least a place where the land is formed, of the substrate, and
the connection member flow-generation means is made of a notch part formed by making a groove at the solder resist so as to be continuously formed extending toward an outside from the land.

14. The mounting substrate as claimed in claim 8, wherein the connection member flow-generation means is formed at the melt-capable connection member arranged on the land, and
the connection member flow-generation means is made of a slit forming part having a width of equal to or more than 10% and less than 50% of a diameter of the melt-capable connection member.

* * * * *